(12) United States Patent
Yang et al.

(10) Patent No.: US 11,901,427 B2
(45) Date of Patent: Feb. 13, 2024

(54) GATE CONTACT ISOLATION IN A SEMICONDUCTOR

(71) Applicant: QUALCOMM Incorporated, San Diego, CA (US)

(72) Inventors: Haining Yang, San Diego, CA (US); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 243 days.

(21) Appl. No.: 17/231,284

(22) Filed: Apr. 15, 2021

(65) Prior Publication Data
US 2022/0336608 A1 Oct. 20, 2022

(51) Int. Cl.
*H01L 29/423* (2006.01)
*H01L 21/8238* (2006.01)
*H01L 27/092* (2006.01)
*H01L 29/40* (2006.01)

(52) U.S. Cl.
CPC ......... *H01L 29/42372* (2013.01); *H01L 21/823828* (2013.01); *H01L 27/092* (2013.01); *H01L 29/401* (2013.01)

(58) Field of Classification Search
CPC ....... H01L 29/42372; H01L 21/823828; H01L 27/092; H01L 29/401
See application file for complete search history.

(56) References Cited

U.S. PATENT DOCUMENTS

| | | |
|---|---|---|
| 10,128,334 B1 | 11/2018 | Bourjot et al. |
| 2015/0048455 A1 | 2/2015 | Basker et al. |
| 2016/0247724 A1* | 8/2016 | Banna ................. H01L 29/7849 |

OTHER PUBLICATIONS

International Search Report and Written Opinion—PCT/US2022/071415—ISA/EPO—dated Jun. 20, 2022.

\* cited by examiner

*Primary Examiner* — Victor A Mandala
*Assistant Examiner* — Colleen E Snow
(74) *Attorney, Agent, or Firm* — Muncy, Geissler, Olds & Lowe, P.C./Qualcomm Incorporated (57) ABSTRACT

In an aspect, a semiconductor device includes a gate. The gate includes a first portion that is located on one end of the gate, a second portion that is located on an opposite end of the gate from the first portion, and a third portion that is located in-between the first portion and the second portion. A first cap located on top of the first portion. A second cap located on top of the second portion. The third portion is capless. A gate contact is located on top of the third portion.

21 Claims, 10 Drawing Sheets

GATE CONTACT ISOLATION IN A SEMICONDUCTOR

BACKGROUND OF THE DISCLOSURE

1. Field of the Disclosure

Aspects of this disclosure relate generally to an integrated circuit (IC), and particularly to improved gate contact isolation in a semiconductor.

2. Description of the Related Art

In a semiconductor (also known as a chip or integrated circuit (IC)), a gate may be used in Complementary Metal Oxide Semiconductor (CMOS) technology nodes. A gate may use a cap to isolate the gate to prevent the gate from electrically shorting to source/drain contact. However, a seam can form inside the cap, resulting in the seam being filled with metal during gate contact formation to create an electrical short between a gate contact and metals above the gate.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In a first aspect, a semiconductor device includes a gate. The gate includes a first portion that is located on one end of the gate, a second portion that is located on an opposite end of the gate from the first portion, and a third portion that is located in-between the first portion and the second portion. A first cap located on top of the first portion. A second cap located on top of the second portion. The third portion is capless. A gate contact is located on top of the third portion.

In a second aspect, a method of fabricating a semiconductor device, such as, for example, a Complementary Metal Oxide Semiconductor (CMOS) device, is disclosed. The method includes forming a gate structure. Forming the gate structure includes forming a first portion located on one end of the gate structure, forming a second portion located on an opposite end of the gate structure from the first portion, and forming a third portion located in-between the first portion and the second portion. The method includes forming a first cap located on top of the first portion, forming a second cap located on top of the second portion, and forming a gate contact located on top of the third portion. The third portion is capless.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof. A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Disclosed are systems and techniques to improve gate contact isolation. A gate is used in Complementary Metal Oxide Semiconductor (CMOS) technology, such as, for example, 5 nanometer (nm) devices. A gate may use a Silicon Nitride (SiN) cap to isolate the gate from electrically shorting with a source/drain (S/D) contact. As the channel length becomes shorter (e.g., 20 nanometers (nm) or less), a seam can form inside the SiN cap. During gate contact formation, the seam may be filled with metal, thereby creating an electrical short between the gate contact and metals above the gate. In addition, to form the gate cap, the gate metal may be recessed, resulting in a higher gate resistance and therefore poorer circuit performance. The systems and techniques described herein address this by creating a device, such as a planar device, a fin Field Effect Transistor (finFET), Gate All Around FET (GAA FET), or another similar type of device, that includes a gate structure that has a gate cap portion and a non-gate cap portion in which a gate contact is located on the non-gate cap portion. The advantages of the systems and techniques prevent an electrical short between the gate contact and metal that is above the gate, thereby reducing gate resistance and improving performance.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "example" and/or "example" are used herein to mean "serving as an example, instance, or illustration." Any aspect described herein as "example" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

As used herein, the terms "user equipment" (UE) and "base station" are not intended to be specific or otherwise limited to any particular radio access technology (RAT), unless otherwise noted. In general, a UE may be any wireless communication device (e.g., a mobile phone, router, tablet computer, laptop computer, consumer asset tracking device, wearable device (e.g., smartwatch, glasses, augmented reality (AR)/virtual reality (VR) headset, etc.), vehicle (e.g., automobile, motorcycle, bicycle, etc.), Internet of Things (IoT) device, etc.) used by a user to communicate over a wireless communications network. A UE may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile device," a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, wireless local area network (WLAN) networks (e.g., based on Institute of Electrical and Electronics Engineers (IEEE) 802.11, etc.) and so on.

A base station may operate according to one of several RATs in communication with UEs depending on the network in which it is deployed, and may be alternatively referred to as an access point (AP), a network node, a NodeB, an evolved NodeB (eNB), a next generation eNB (ng-eNB), a New Radio (NR) Node B (also referred to as a gNB or gNodeB), etc. A base station may be used primarily to support wireless access by UEs, including supporting data, voice, and/or signaling connections for the supported UEs. In some systems a base station may provide purely edge node signaling functions while in other systems it may provide additional control and/or network management functions. A communication link through which UEs can send RF signals to a base station is called an uplink (UL) channel (e.g., a reverse traffic channel, a reverse control channel, an access channel, etc.). A communication link through which the base station can send RF signals to UEs is called a downlink (DL) or forward link channel (e.g., a paging channel, a control channel, a broadcast channel, a forward traffic channel, etc.). As used herein the term traffic channel (TCH) can refer to either an uplink/reverse or downlink/forward traffic channel.

The term "base station" may refer to a single physical transmission-reception point (TRP) or to multiple physical TRPs that may or may not be co-located. For example, where the term "base station" refers to a single physical TRP, the physical TRP may be an antenna of the base station corresponding to a cell (or several cell sectors) of the base station. Where the term "base station" refers to multiple co-located physical TRPs, the physical TRPs may be an array of antennas (e.g., as in a multiple-input multiple-output (MIMO) system or where the base station employs beamforming) of the base station. Where the term "base station" refers to multiple non-co-located physical TRPs, the physical TRPs may be a distributed antenna system (DAS) (a network of spatially separated antennas connected to a common source via a transport medium) or a remote radio head (RRH) (a remote base station connected to a serving base station). Alternatively, the non-co-located physical TRPs may be the serving base station receiving the measurement report from the UE and a neighbor base station whose reference RF signals (or simply "reference signals") the UE is measuring. Because a TRP is the point from which a base station transmits and receives wireless signals, as used herein, references to transmission from or reception at a base station are to be understood as referring to a particular TRP of the base station.

In some implementations that support positioning of UEs, a base station may not support wireless access by UEs (e.g., may not support data, voice, and/or signaling connections for UEs), but may instead transmit reference signals to UEs to be measured by the UEs, and/or may receive and measure signals transmitted by the UEs. Such a base station may be referred to as a positioning beacon (e.g., when transmitting signals to UEs) and/or as a location measurement unit (e.g., when receiving and measuring signals from UEs).

An "RF signal" comprises an electromagnetic wave of a given frequency that transports information through the space between a transmitter and a receiver. As used herein, a transmitter may transmit a single "RF signal" or multiple "RF signals" to a receiver. However, the receiver may receive multiple "RF signals" corresponding to each transmitted RF signal due to the propagation characteristics of RF signals through multipath channels. The same transmitted RF signal on different paths between the transmitter and receiver may be referred to as a "multipath" RF signal. As used herein, an RF signal may also be referred to as a "wireless signal," a "radar signal," a "radio wave," a "waveform," or the like, or simply a "signal" where it is clear from the context that the term "signal" refers to a wireless signal or an RF signal.

As a first example, an apparatus includes a Complementary Metal Oxide Semiconductor (CMOS). The CMOS includes a gate. The gate includes: a first portion located on one end of the gate, a second portion located on an opposite end of the first portion, and a third portion located in-between the first portion and the second portion. The CMOS includes a first cap located on top of the first portion and a second cap located on top of the second portion. The CMOS includes a gate contact located on top of the third portion. The first cap and the second cap comprise Silicon Nitride (SiN). The first cap includes a first gate cap seam and the second cap includes a second gate cap seam. The semiconductor includes a Field Effect Transistor (FET) selected from the group consisting of: a Planar Field Effect Transistor, a fin Field Effect Transistor (finFET), and a Gate All Around Field Effect Transistor (GAA FET).

As a second example, a method of fabricating a semiconductor, such as, for example, a Complementary Metal Oxide Semiconductor (CMOS), is disclosed. The method includes forming a gate structure. Forming the gate structure includes forming a first portion located on one end of the gate structure, forming a second portion located on an opposite end of the first portion, and forming a third portion located in-between the first portion and the second portion. The method includes forming a first cap located on top of the first portion, forming a second cap located on top of the second portion, and forming a gate contact located on top of the third portion. The first cap and the second cap may each include Silicon Nitride (SiN). The semiconductor may include a Field Effect Transistor (FET) selected from the group consisting of: a Planar Field Effect Transistor, a fin Field Effect Transistor (finFET), and a Gate All Around Field Effect Transistor (GAA FET). Forming the first portion includes forming a P-type Metal Oxide Semiconductor. Forming the second portion includes forming an N-type Metal Oxide Semiconductor. The method includes forming a gate conductor layer, forming one or more work function metal layers, forming a gate oxide layer, forming a gate spacer, and forming a source/drain contact. 23. The method includes incorporating the semiconductor into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Figure 1:
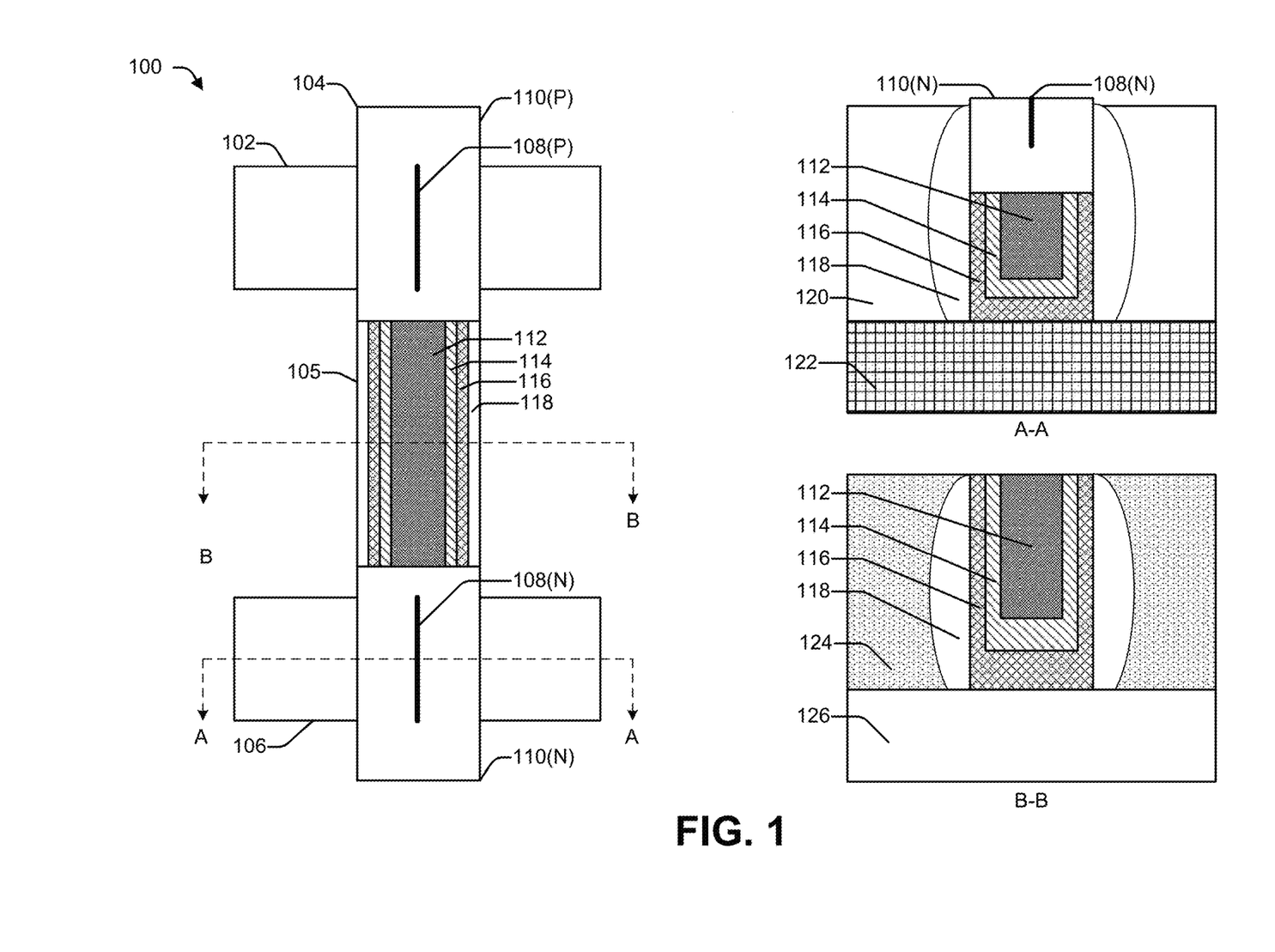
FIG. 1 illustrates a block diagram of an exemplary gate structure, according to various aspects of the disclosure.

FIG. 1 illustrates a block diagram of an exemplary gate structure 100, according to various aspects of the disclosure. The gate structure 100 includes a P-type Metal Oxide Semiconductor (PMOS) 102 (e.g., a first active portion), a gate 104, and an N-type Metal Oxide Semiconductor (NMOS) 106 (e.g., a second active portion). A gate cap seam 108(P) is located in a gate cap 110(P) (e.g., a first portion) above the PMOS 102 and a gate cap seam 108(N) (e.g., a second portion) is located in a gate cap 110(N) above the NMOS 106.

A cross-section A-A of the gate structure 100 at the NMOS 106 illustrates the gate cap seam 108(N) in the gate cap 110(N). Similarly, a cross-section of the gate structure at the PMOS 102 includes the gate cap seam 108(P) in the gate cap 110(P). The gate structure 100 includes a gate conductor 112, one or more work function metal layers 114, a gate oxide 116, a gate spacer 118, a source/drain contact 120, and a Silicon (Si) active 122 layer. The gate conductor 112 may include, for example, Tungsten (W), Aluminum (Al), a metal silicide such as Titanium Disilicide ($TiSi_2$), another type of metal-based material, or any combination thereof.

A field portion 105 (e.g., a third portion, which is capless) of the gate 104 is located between the gate cap 110(P) (e.g., the first portion) and the gate cap 110(N) (e.g., the second portion). A cross-section B-B of the field portion 105, e.g., between the PMOS 102 and the NMOS 106, includes the gate conductor 112, the one or more work function metal layers 114, the gate oxide 116, the gate spacer 118, an Inter-Layer Dielectric (ILD) 124, and an oxide layer 126. Note the absence of the gate caps 110 (and the corresponding gate seams 108) in the cross-section B-B. Thus, the gate caps 110(P), 110(N) are placed over the PMOS 102, NMOS 106, respectively, while the field portion 105 of the gate 104, e.g., between the gate caps 110(P), 110(N), does not include a cap. While an N-type and a P-type are illustrated in FIG. 1, in some aspects, both 102, 106 may be an N-type or both 102, 106 may be a P-type. An advantage of not having a cap over the field portion of the gate (e.g., the third portion that is capless) includes reducing a possibility of an electrical short between the gate contact and metal that is above the gate. An additional advantage is that gate resistance may be reduced, thereby improving performance.

Figure 2:
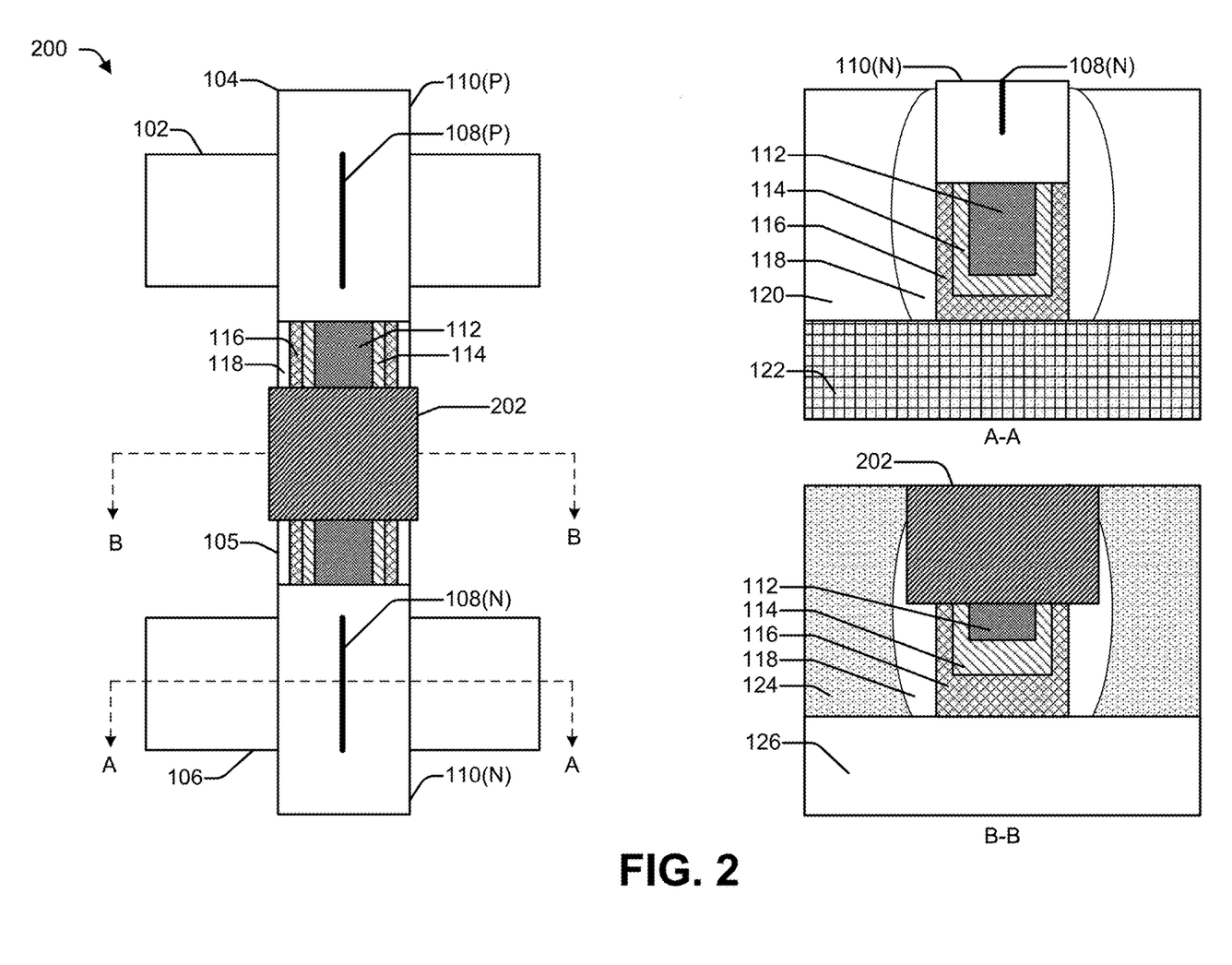
FIG. 2 illustrates a block diagram of an exemplary gate structure that includes a gate contact, according to various aspects of the disclosure.

FIG. 2 illustrates a block diagram of an exemplary gate structure 200 that includes a gate contact 202, according to various aspects of the disclosure. In the gate structure 200, a gate contact 202 is placed on top of the field portion 105 that does not include a cap. In some cases, the gate contact 202 may be inserted on the NMOS 106 or the PMOS 102 to reduce an impact of gate resistance on circuit performance.

FIGS. 3, 4, 5, 6 illustrate different stages in an example fabrication of a gate structure 300 similar to gate structure 200. To illustrate the various aspects of disclosure, example methods of fabrication are presented. Other methods of fabrication are possible and the discussed fabrication processes are presented only to aid understanding of the concepts disclosed herein and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 3:
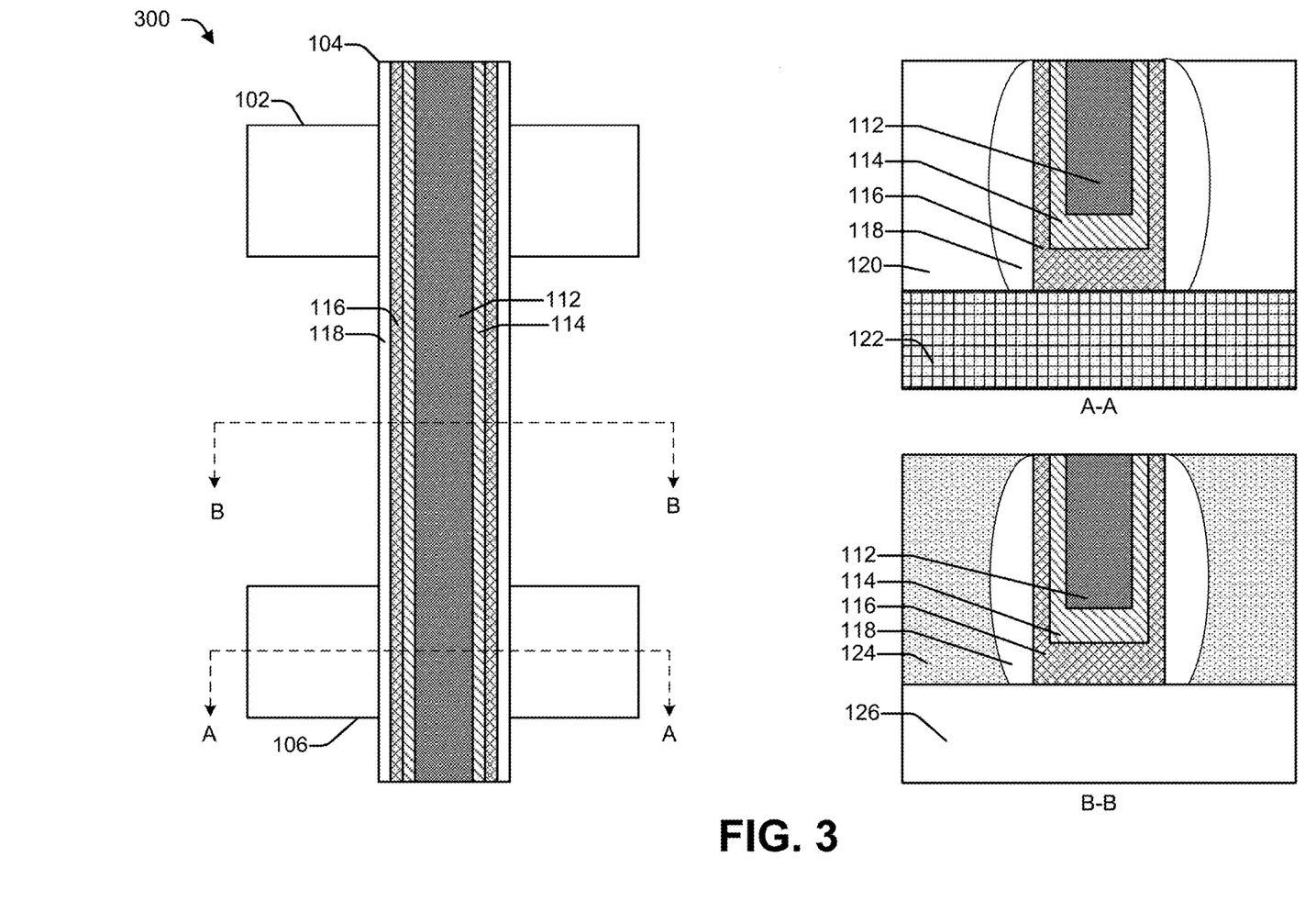
FIG. 3 illustrates a portion of a fabrication process for a gate structure, according to various aspects of the disclosure.

FIG. 3 illustrates a portion of a fabrication process for the gate structure 300, according to various aspects of the disclosure. The gate structure 300 is formed, in some aspects, with a conventional metal gate structure. The gate structure 300 includes a gate 104 across the PMOS 102 and the NMOS 106. The gate structure 300 at this stage has gate conductor 112 layer, the one or more work function metal layers 114, the gate oxide 116 layer, the gate spacer 118, all formed. In the cross-sectional view at A-A, the various portions of the gate structure 300 previously discussed are labeled and the individual portions will not be repeated. Additionally, illustrated in cross-sectional view at A-A is the source/drain contact 120 which is formed on the Silicon (Si) active 122 layer. In the cross-sectional view at B-B, the various portions of the gate structure 300 previously discussed are labeled and the individual portions will not be repeated. Additionally, illustrated in cross-sectional view at B-B is the Inter-Layer Dielectric (ILD) 124, which is formed on the oxide layer 126.

Figure 4:
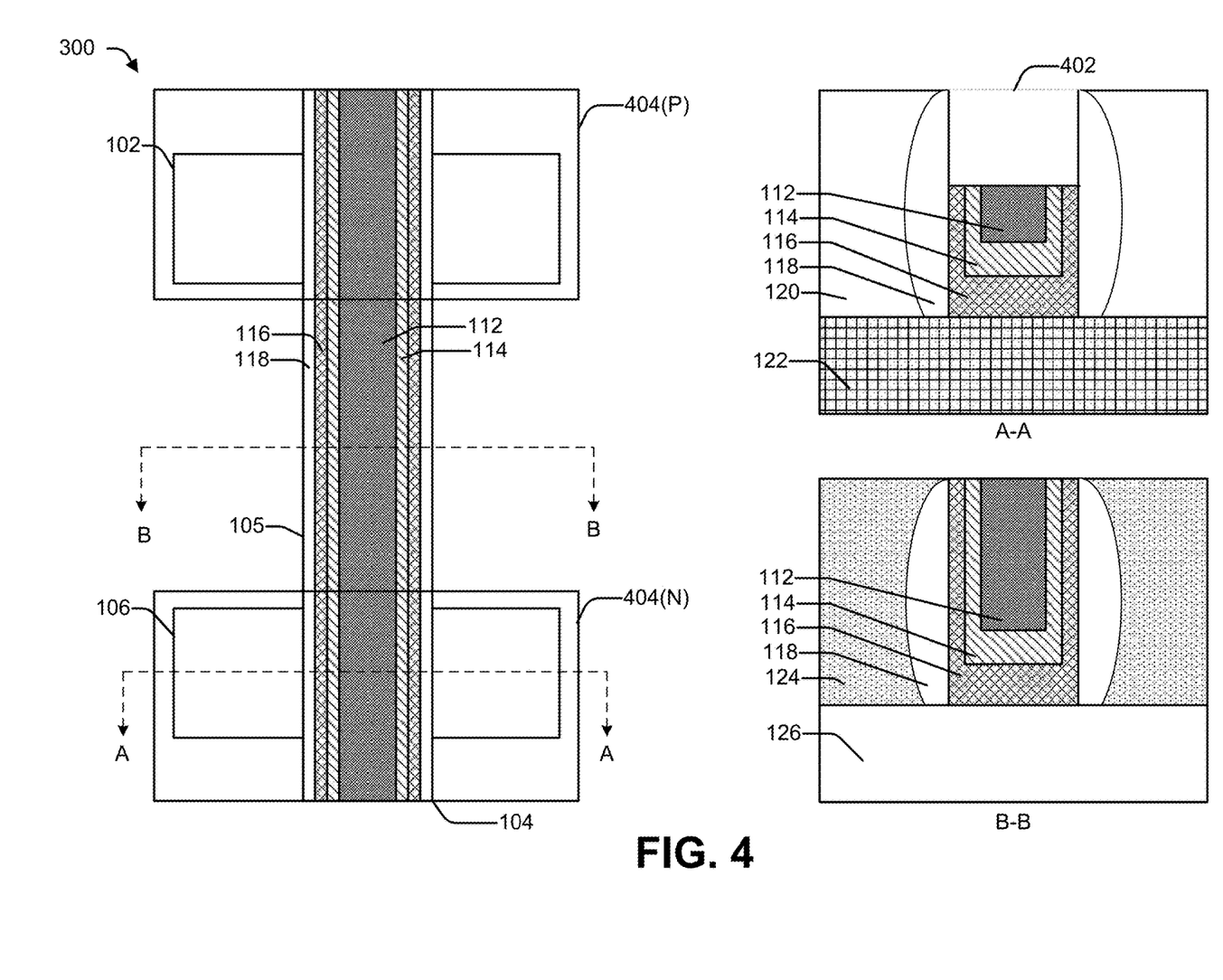
FIG. 4 illustrates a further portion of a fabrication process for the gate structure, according to various aspects of the disclosure.

FIG. 4 illustrates a further portion of a fabrication process for the gate structure 300, according to various aspects of the disclosure. A recessed portion of the gate 402 is created using a mask 404(P) on a first portion of the gate that includes the PMOS 102, and a mask 404(N) on a second portion of the gate that includes the NMOS 106 by performing a metal etch to form the recessed portion of the gate 402. The gate structure 300 at this stage has recessed portion of the gate 402 which has reduced the height of conductor 112 layer, the one or more work function metal layers 114 and the gate oxide 116 layer, as illustrated in the cross-sectional view at A-A. For example, a CMP may be performed to expose metal layers and a dry etch may be used to recess the metal. The process may selectively recess a middle portion of the gate 104 to create the recessed portion of the gate 402. In the cross-sectional view at B-B, the various portions of the gate structure 300 previously discussed are labeled and the individual portions will not be repeated, as there is no change to the field portion 105 (third portion) at this stage.

Figure 5:
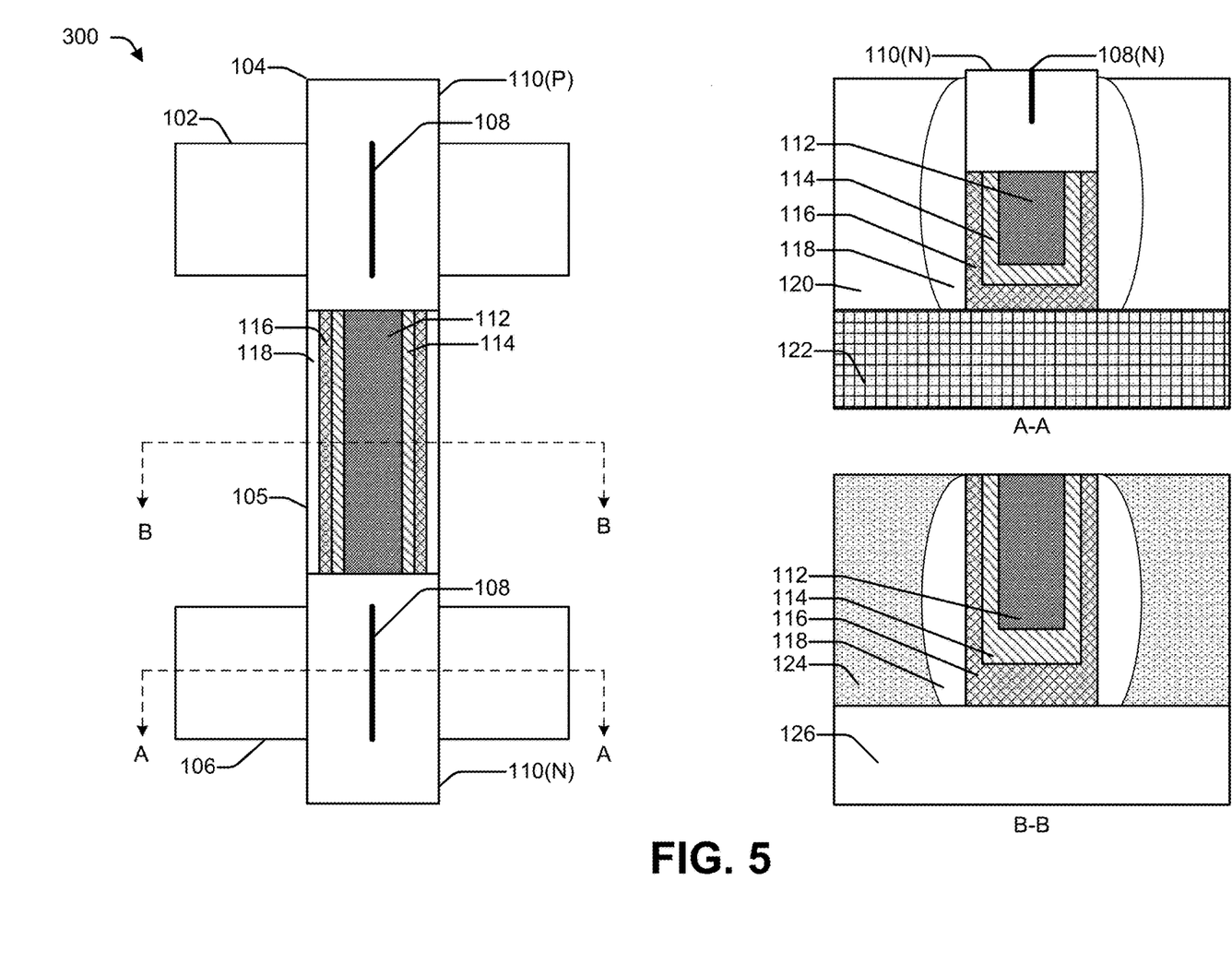
FIG. 5 illustrates a further portion of a fabrication process for the gate structure, according to various aspects of the disclosure.

FIG. 5 illustrates a further portion of a fabrication process for the gate structure 300, according to various aspects of the disclosure. Gate cap 110(P) and gate cap 110(N) are formed, according to various aspects of the disclosure. Silicon Nitride (SiN) is deposited on the first portion of the gate 104, which over the PMOS 102, and a chemical-mechanical polish (CMP) is performed to create the gate cap 110(P). SiN is deposited over the second portion of the gate 104, which is over the NMOS 106, and the CMP is performed to create the gate cap 110(N). The gate cap seam 108(N) is formed in the gate cap 110(N) and the gate cap seam 108(P) is formed in the gate cap 110(P). SiN is not deposited over the field portion 105 (third portion) and therefore there is no gate cap over the field portion 105, e.g., the field portion 105 is capless. The middle portion of the gate 104 over PMOS 102 and NMOS 106 had the recessed portion of the gate 402 into which the process deposits SiN before performing a second CMP.

Figure 6:
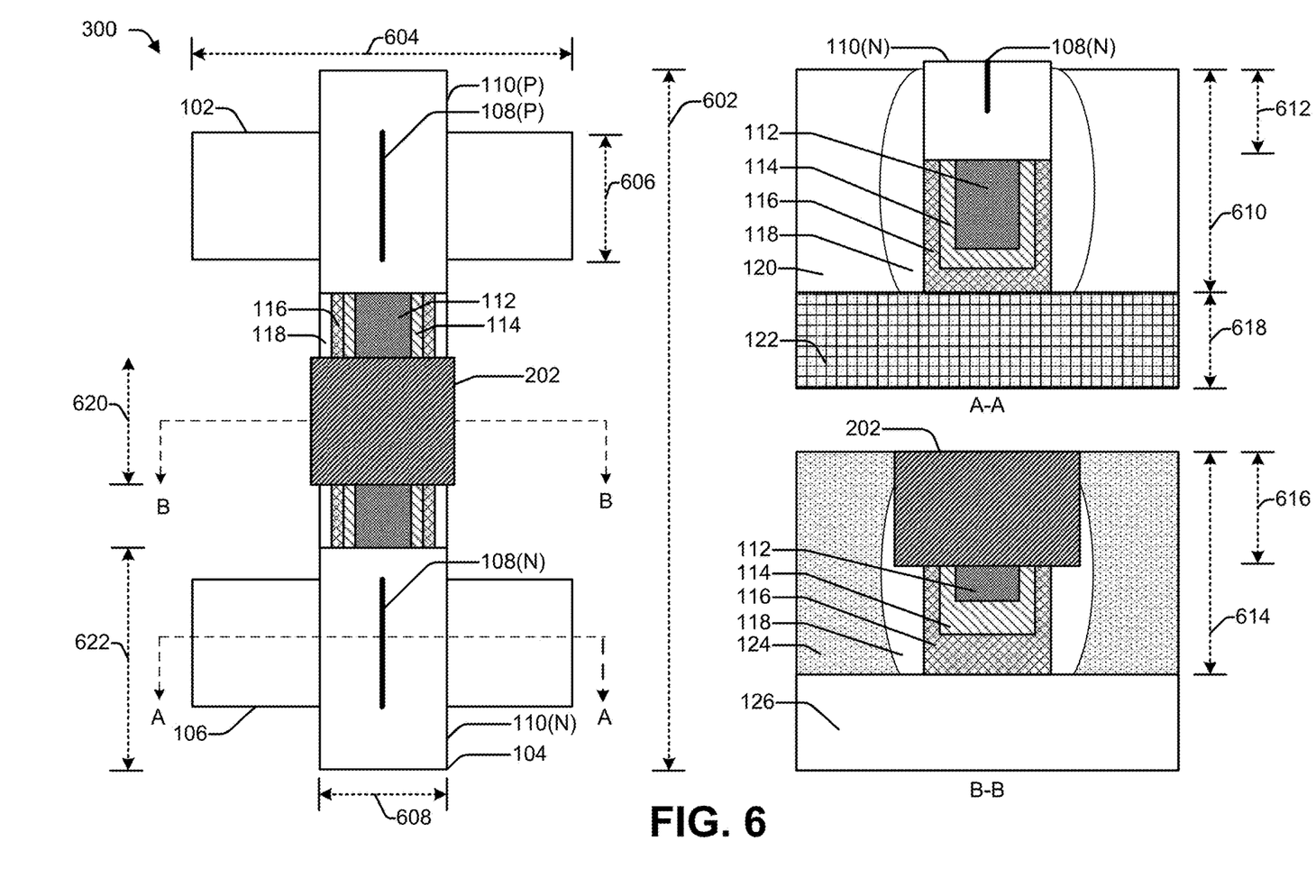
FIG. 6 illustrates a further portion of a fabrication process for the gate structure, according to various aspects of the disclosure.

FIG. 6 illustrates a further portion of a fabrication process for the gate structure 300, according to various aspects of the disclosure. In the field portion 105 (third portion), which is capless (does not have a gate cap) a gate contact 202 is formed on top of the field portion 105 (third portion) of the gate 104. The gate contact 202 can penetrate deeper into the filled portions (e.g., gate conductor 112 layer, the one or more work function metal layers 114, and the gate oxide 116). In accordance with the various aspects disclosed, the gate contact 202 can be easier to add (e.g., compared to if the gate caps 110 extended across the entire top portion of the gate 104).

The gate cap seam 108(P) is constrained to a middle portion of the SiN of the gate cap 110(P) and the gate cap seam 108(N) is constrained to a middle portion of the SiN of the gate cap 110(N) due to the nature of the deposition of the SiN around side walls. In this way, an electrical short cannot occur between the gate contact 202 and the metal in the gate cap seams 108, thereby offering the advantages of reduced gate resistance and improved performance.

Various example dimensions are provided herein as an aid to explaining the various aspects disclosed. It will be appreciated that these the various aspects disclosed are not limited to these example dimensions. A length 602 is between about 0.03 micrometers (μm) to 0.15 μm, and in some aspects, is preferably about 0.15 μm. A width 604 is between about 40 nanometers (nm) to about 250 nm, and in some aspects is preferably about 70 nm. A width 606 is between about 0.01 μm to about 5 μm, and in some aspects is preferably about 0.05 μm. A width 608 is between about 7 nm to about 150 nm, and in some aspects is preferably about 15 nm. A height 610 is between about 50 nm to about 200 nm, and in some aspects is preferably about 100 nm. A height 612 is between about 20 nm to about 100 nm, and in some aspects is preferably about 50 nm. A height 614 is between about 50 nm to about 200 nm, and in some aspects is preferably about 100 nm. A height 616 is between about 20 nm to about 100 nm, and in some aspects is preferably about 50 nm. A height 618 of the Si substrate can vary widely. For example, in some cases, the height 618 may be between about 100 μm to about 1000 μm and in some aspects is preferably about 150 μm. In silicon on insulator (SOI) technology, the height 618 may be between about 10 μm to about 500 μm and in some aspects is preferably about 30 μm. The gate contact 202 has a width 620 of between about 10 nm to about 100 nm and in some aspects is preferably about 25. In some cases, the gate contact 202 may be approximately square, such as, for example, 25 nm (length) by 25 nm (width) while in other cases the gate contact 202 may be rectangular, such as, for example, 25 nm (length) by 30 nm (width). A length 622 (e.g., for each of 110(P) and 110(N)) is between about 0.01 μm to about 5 μm, and in some aspects, is preferably about 0.05 μm.

Figure 7:
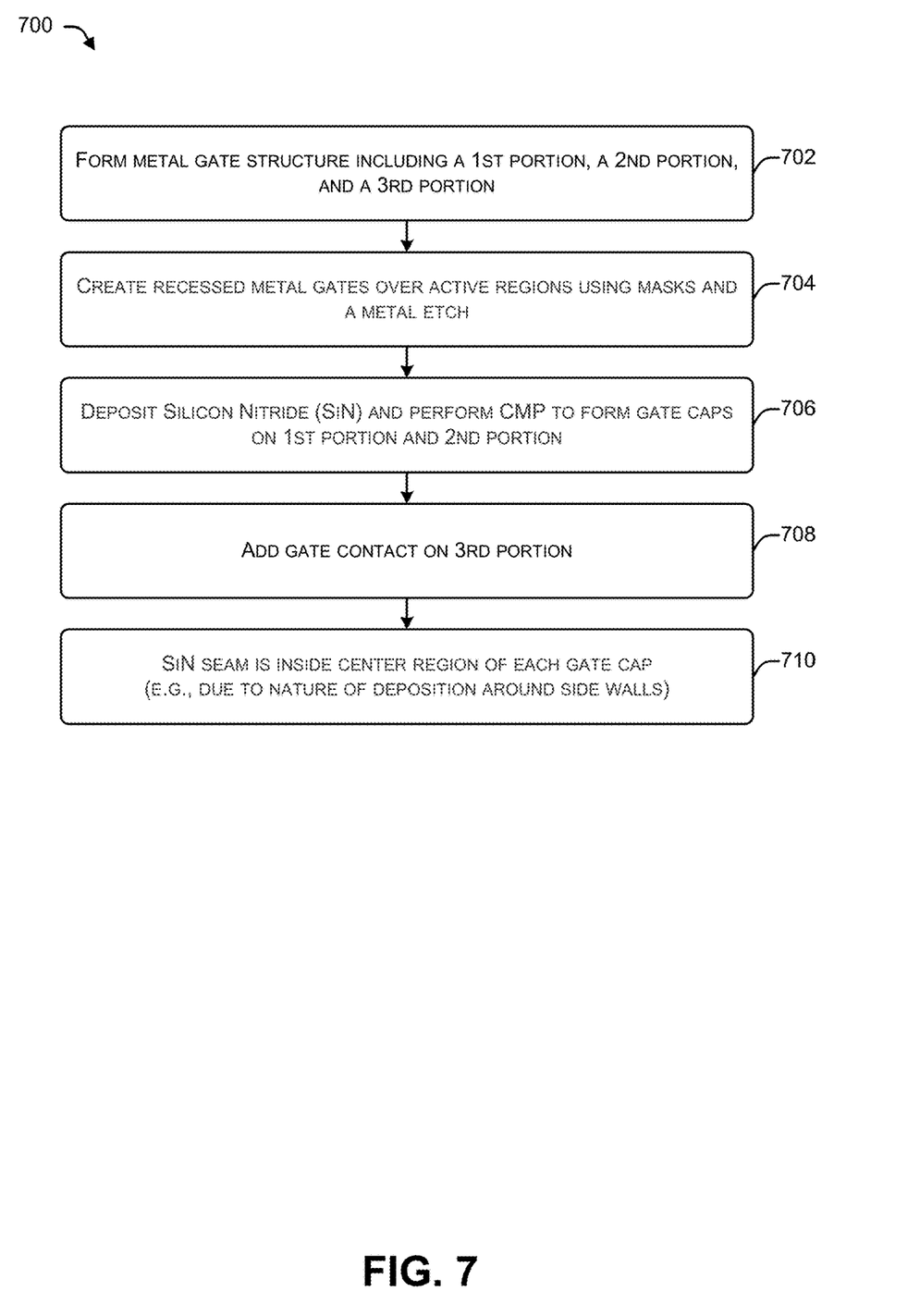
FIG. 7 illustrates an example process that includes depositing Silicon Nitride (SiN) to form a gate cap, according to aspects of the disclosure.

In the flow diagram of FIG. 7, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the process 700 is described with reference to FIGS. 1, 2, 3, 4, 5, and 6 as described above, although other models, frameworks, systems and environments may be used to implement these processes.

FIG. 7 illustrates an example process 700 that includes depositing Silicon Nitride (SiN) to form a gate cap, according to aspects of the disclosure. The process 700 may be performed as part of a semiconductor manufacturing process.

At 702, the process forms a gate structure. For example, in FIG. 3, the gate structure is created, including the PMOS 102 (first portion), NMOS 106 (second portion), and the field portion 105 (third portion). Forming the gate structure includes forming the gate conductor 112 layer, forming the one or more work function metal layers 114, forming the gate oxide 116 layer, and forming the gate spacer 118. For the PMOS 102 (first portion) and the NMOS 106 (second portion), the process includes forming the source/drain contact 120 and Silicon (Si) active 122 layer. For the field portion 105 (third portion), the process includes forming the Inter-Layer Dielectric (ILD) 124 and forming the oxide layer 126.

At 704, the process creates recessed gates over active portions using masks and a metal etch. For example, in FIG. 4, the process uses the masks 404 to create the recessed gates 402 over the PMOS 102 and the NMOS 106.

At 708, the process deposits SiN to form gate caps. At 808, the process performs CMP to complete forming the gate caps. For example, in FIG. 5, the process deposits SiN and performs a CMP to create the gate caps 110(P), 110(N).

At 710, the SiN seam is inside a center portion of each gap (e.g., due to a nature of depositing the SiN around side walls). For example, in FIG. 6, the gate cap seams 108(P), 108(N) are inside a center portion of the gate caps 110(P), 110(N), respectively. The technical advantages include preventing an electrical short between the gate contact 202 and the metal in the gate cap seams 108.

Figure 8:
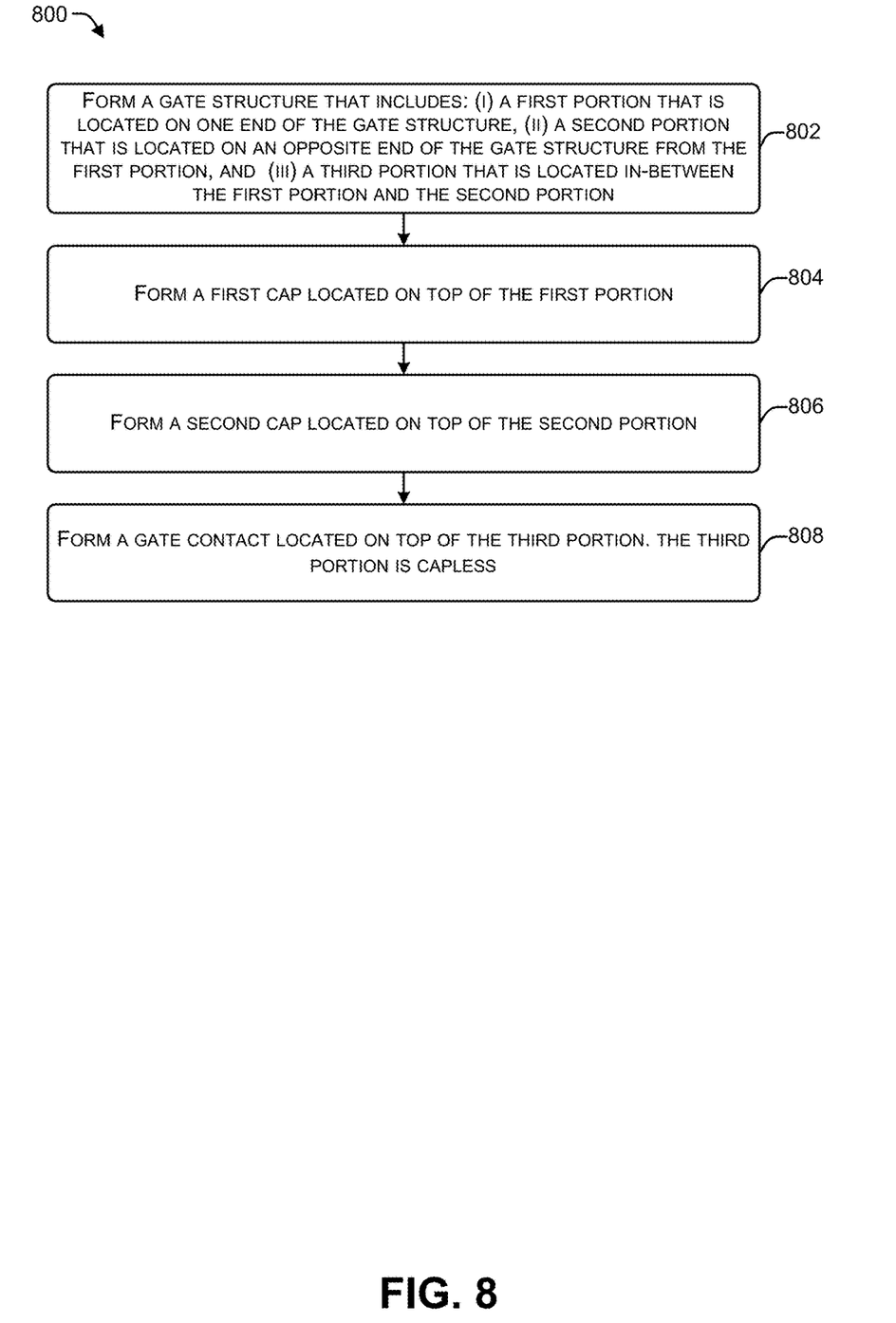
FIG. 8 illustrates an example process that includes forming a gate contact located on top of a third portion that is capless, according to various aspects of the disclosure.

FIG. 8 illustrates an example process 800 that includes forming a gate contact located on top of a third portion that is capless, according to various aspects of the disclosure. The process 800 may be performed as part of a fabrication process to form a gate structure, as described herein.

At 802, the process 800 forms a gate structure that includes: (i) a first portion that is located on one end of the gate structure, (ii) a second portion that is located on an opposite end of the gate structure from the first portion, and (iii) a third portion that is located in-between the first portion and the second portion. For example, in FIG. 3, the gate structure is formed, including the PMOS 102 (first portion), NMOS 106 (second portion), and the field portion 105 (third portion).

At 804, the process 800 forms a first cap that is located on top of the first portion. At 806, the process 800 forms a second cap that is located on top of the second portion. For example, in FIG. 5, the process deposits SiN and performs a CMP to create the gate caps 110(P), 110(N).

At 808, the process 800 forms a gate contact that is located on top of the third portion. The third portion is capless. For example, in FIG. 6, the gate contact 202 is formed on top of the field portion 105. The field portion 105 (third portion) is capless, as illustrated in FIG. 6. The technical advantages include locating the gate cap seams 108(P), 108(N) inside a center portion of the gate caps 110(P), 110(N), respectively, thereby preventing an electrical short between the gate contact 202 and the metal in the gate cap seams 108.

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 9:
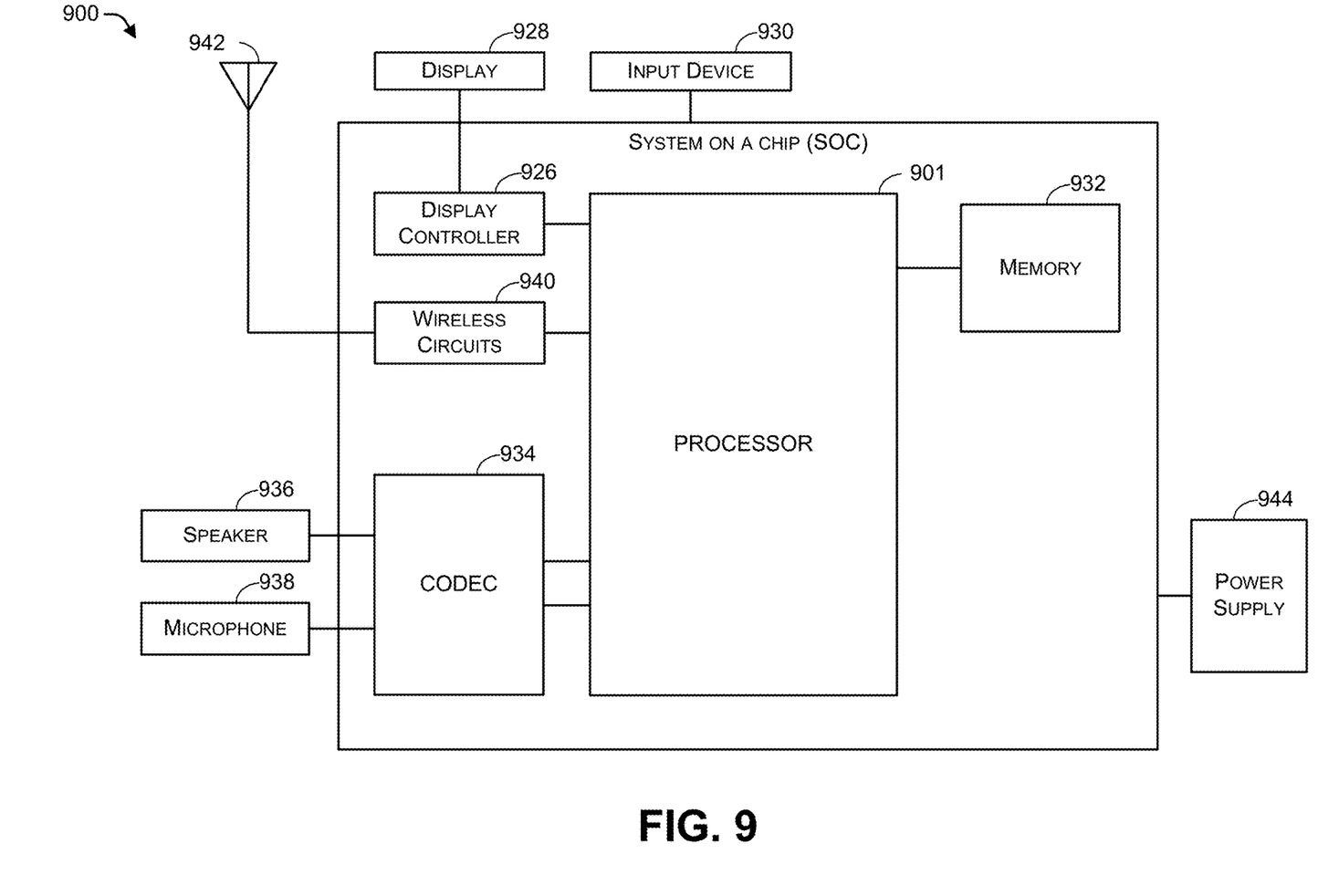
FIG. 9 illustrates an exemplary mobile device in accordance with one or more aspects of the disclosure.

FIG. 9 illustrates an exemplary mobile device 900 in accordance with some examples of the disclosure. Referring now to FIG. 9, a block diagram of a mobile device that is configured according to exemplary aspects is depicted and generally designated mobile device 900. In some aspects, mobile device 900 may be configured as a wireless communication device. As shown, mobile device 900 includes processor 901. Processor 901 may be communicatively coupled to memory 932 over a link, which may be a die-to-die or chip-to-chip link. Processor 901 is a hardware device capable of executing logic instructions. Mobile device 900 also includes display 928 and display controller 926, with display controller 926 coupled to processor 901 and to display 928.

In some aspects, FIG. 9 may include coder/decoder (CODEC) 934 (e.g., an audio and/or voice CODEC) coupled to processor 901; speaker 936 and microphone 938 coupled to CODEC 934; and wireless circuits 940 (which may include a modem, RF circuitry, filters, etc., which may be implemented using a semiconductor with the gate structure as described herein) coupled to wireless antenna 942 and to processor 901.

In a particular aspect, where one or more of the above-mentioned blocks are present, processor 901, display controller 926, memory 932, CODEC 934, and wireless circuits 940 can include the gate structure 200 which may be implemented in whole or part using the techniques disclosed herein. Input device 930 (e.g., physical or virtual keyboard), power supply 944 (e.g., battery), display 928, input device 930, speaker 936, microphone 938, wireless antenna 942, and power supply 944 may be external to the mobile device 900 and may be coupled to a component of mobile device 900, such as an interface or a controller.

It should be noted that although FIG. 9 depicts a mobile device 900, processor 901 and memory 932 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 10:
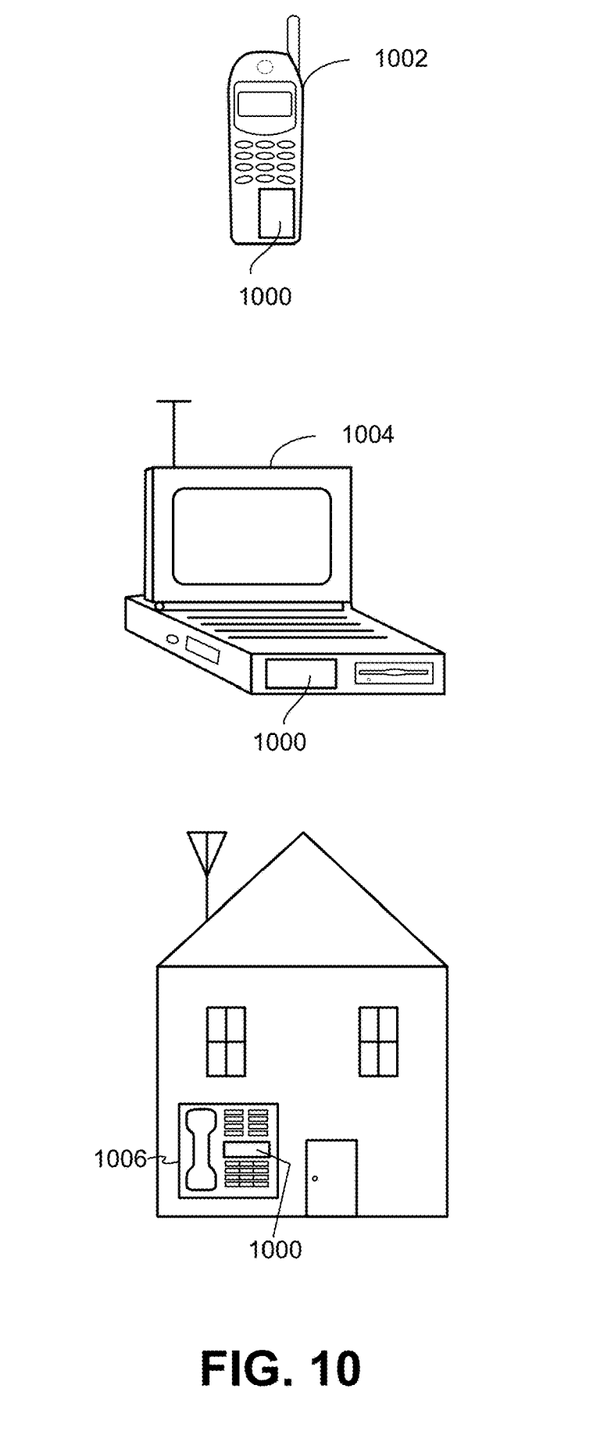
FIG. 10 illustrates various electronic devices that may be integrated with an integrated device or a semiconductor device in accordance with one or more aspects of the disclosure.

FIG. 10 illustrates various electronic devices that may be integrated with any of the aforementioned integrated device or semiconductor device accordance with various examples of the disclosure. For example, a mobile phone device 1002, a laptop computer device 1004, and a fixed location terminal device 1006 may each be considered generally user equipment (UE) and may include semiconductor 1000 (e.g., including the gate structure 200) as described herein. The semiconductor 1000 may be, for example, be included in any of the integrated circuits, dies, integrated devices, integrated device packages, integrated circuit devices, device packages, integrated circuit (IC) packages, package-on-package devices described herein. The devices 1002, 1004, 1006 illustrated in FIG. 10 are merely exemplary. Other electronic devices may also feature the semiconductor 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It can be noted that, although particular frequencies, integrated circuits (ICs), hardware, and other features are described in the aspects herein, alternative aspects may vary. That is, alternative aspects may utilize additional or alternative frequencies (e.g., other the 60 GHz and/or 28 GHz frequency bands), antenna elements (e.g., having different size/shape of antenna element arrays), scanning periods (including both static and dynamic scanning periods), electronic devices (e.g., WLAN APs, cellular base stations, smart speakers, IoT devices, mobile phones, tablets, personal computer (PC), etc.), and/or other features. A person of ordinary skill in the art will appreciate such variations.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

In view of the descriptions and explanations above, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause. Implementation examples are described in the following numbered clauses:

Clause 1. A semiconductor device comprising: a gate comprising: a first portion that is located on one end of the gate; a second portion that is located on an opposite end of the gate from the first portion, and a third portion that is located in-between the first portion and the second portion; a first cap located on top of the first portion; a second cap located on top of the second portion; and a gate contact located on top of the third portion, wherein the third portion is capless.

Clause 2. The semiconductor device of clause 1, wherein: the first cap and the second cap comprise Silicon Nitride (SiN).

Clause 3. The semiconductor device of any of clauses 1 to 2, wherein: the first cap includes a first gate cap seam; and the second cap includes a second gate cap seam.

Clause 4. The semiconductor device of any of clauses 1 to 3, wherein the semiconductor device comprises a Field Effect Transistor (FET) selected from the group consisting of: a Planar Field Effect Transistor, a fin Field Effect Transistor (finFET), and a Gate All Around Field Effect Transistor (GAA FET).

Clause 5. The semiconductor device of any of clauses 1 to 4, wherein: the first portion is coupled to a P-type Metal Oxide Semiconductor.

Clause 6. The semiconductor device of any of clauses 1 to 5, wherein: the second portion is coupled to an N-type Metal Oxide Semiconductor.

Clause 7. The semiconductor device of any of clauses 1 to 6, wherein the gate further comprises: a gate conductor layer; one or more work function metal layers; a gate oxide layer; and a gate spacer.

Clause 8. The semiconductor device of any of clauses 1 to 7, wherein the second portion is coupled to: a source/drain contact; and a Silicon (Si) layer.

Clause 9. The semiconductor device of any of clauses 1 to 8, wherein the third portion is coupled to: an Inter-Layer Dielectric (ILD); and an oxide layer.

Clause 10. The semiconductor device of any of clauses 1 to 9, wherein: the gate has a length of between about 0.3 to about 15 micrometers; and the gate has a width of between about 40 to about 250 nanometers.

Clause 11. The semiconductor device of any of clauses 1 to 10, wherein: the first cap has a length of between about 0.1 to about 5 micrometers; and the first cap has a width of between about 7 to about 150 nanometers.

Clause 12. The semiconductor device of any of clauses 1 to 11, wherein: the gate contact has a length of between about 10 to about 100 nanometers (nm); and the gate contact has a width of between about 10 to about 100 nm.

Clause 13. The semiconductor device of any of clauses 1 to 12, wherein: the gate contact has a thickness of between about 20 to about 100 nanometers.

Clause 14. The semiconductor device of any of clauses 1 to 13, wherein the semiconductor device is incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Clause 15. A method of fabricating a semiconductor device, the method comprising: forming a gate structure, the gate structure comprising: a first portion that is located on one end of the gate structure; a second portion that is located on an opposite end of the gate structure from the first portion, and a third portion that is located in-between the first portion and the second portion; forming a first cap located on top of the first portion; forming a second cap located on top of the second portion; and forming a gate contact located on top of the third portion, wherein the third portion is capless.

Clause 16. The method of clause 15, wherein: the first cap and the second cap comprise Silicon Nitride (SiN).

Clause 17. The method of any of clauses 15 to 16, wherein the semiconductor device comprises a Field Effect Transistor (FET) selected from the group consisting of: a Planar Field Effect Transistor, a fin Field Effect Transistor (finFET), and a Gate All Around Field Effect Transistor (GAA FET).

Clause 18. The method of any of clauses 15 to 17, wherein the first portion is coupled to a P-type Metal Oxide Semiconductor.

Clause 19. The method of any of clauses 15 to 18, wherein the second portion is coupled to an N-type Metal Oxide Semiconductor.

Clause 20. The method of any of clauses 15 to 19, further comprising incorporating the semiconductor device into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

Moreover, the methods, sequences, and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor (e.g., cache memory).

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. A semiconductor device comprising:
   a gate comprising:
      a first portion that is located on one end of the gate;
      a second portion that is located on an opposite end of the gate from the first portion;
      a third portion that is located in-between the first portion and the second portion; and
      a fourth portion that is located in-between the first portion and the third portion;
   a first cap located on top of the first portion;
   a second cap located on top of the second portion; and
   a gate contact located on top of the third portion, wherein the fourth portion is capless and contactless.

2. The semiconductor device of claim 1, wherein:
   the first cap and the second cap comprise Silicon Nitride (SiN).

3. The semiconductor device of claim 1, wherein:
   the first cap includes a first cap seam; and
   the second cap includes a second cap seam.

4. The semiconductor device of claim 1, wherein the semiconductor device comprises a Field Effect Transistor (FET) selected from the group consisting of:
   a Planar Field Effect Transistor, a fin Field Effect Transistor (finFET), and a Gate All Around Field Effect Transistor (GAA FET).

5. The semiconductor device of claim 1, wherein:
   the first portion is coupled to a P-type Metal Oxide Semiconductor.

6. The semiconductor device of claim 1, wherein:
   the second portion is coupled to an N-type Metal Oxide Semiconductor.

7. The semiconductor device of claim 1, wherein the gate further comprises:
   a gate conductor layer;
   one or more work function metal layers;
   a gate oxide layer; and
   a gate spacer.

8. The semiconductor device of claim 1, wherein the second portion is coupled to:
   a source/drain contact; and
   a Silicon (Si) layer.

9. The semiconductor device of claim 1, wherein the third portion is coupled to:
   an Inter-Layer Dielectric (ILD); and
   an oxide layer.

10. The semiconductor device of claim 1, wherein:
    the gate has a length of between about 0.3 to about 15 micrometers; and
    the gate has a width of between about 40 to about 250 nanometers.

11. The semiconductor device of claim 1, wherein:
    the first cap has a length of between about 0.1 to about 5 micrometers; and
    the first cap has a width of between about 7 to about 150 nanometers.

12. The semiconductor device of claim 1, wherein:
    the gate contact has a length of between about 10 to about 100 nanometers (nm); and
    the gate contact has a width of between about 10 to about 100 nm.

13. The semiconductor device of claim 1, wherein:
    the gate contact has a thickness of between about 20 to about 100 nanometers.

14. The semiconductor device of claim 1, wherein the semiconductor device is incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

15. The semiconductor device of claim 1, wherein at least a portion of the first cap and at least a portion of the second cap are located between gate spacers.

16. A method of fabricating a semiconductor device, the method comprising:
  forming a gate structure, the gate structure comprising:
    a first portion that is located on one end of the gate structure;
    a second portion that is located on an opposite end of the gate structure from the first portion;
    a third portion that is located in-between the first portion and the second portion; and
    a fourth portion that is located in-between the first portion and the third portion;
  forming a first cap located on top of the first portion;
  forming a second cap located on top of the second portion; and
  forming a gate contact located on top of the third portion, wherein the fourth portion is capless and contactless.

17. The method of claim 16, wherein:
  the first cap and the second cap comprise Silicon Nitride (SiN).

18. The method of claim 16, wherein the semiconductor device comprises a Field Effect Transistor (FET) selected from the group consisting of:
  a Planar Field Effect Transistor, a fin Field Effect Transistor (finFET), and a Gate All Around Field Effect Transistor (GAA FET).

19. The method of claim 16, wherein the first portion is coupled to a P-type Metal Oxide Semiconductor.

20. The method of claim 16, wherein the second portion is coupled to an N-type Metal Oxide Semiconductor.

21. The method of claim 16, further comprising incorporating the semiconductor device into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

* * * * *